US008193591B2

(12) United States Patent
Green et al.

(10) Patent No.: US 8,193,591 B2
(45) Date of Patent: Jun. 5, 2012

(54) TRANSISTOR AND METHOD WITH DUAL LAYER PASSIVATION (75) Inventors: Bruce M. Green, Gilbert, AZ (US); Haldane S. Henry, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 917 days.

(21) Appl. No.: 11/404,714

(22) Filed: Apr. 13, 2006

(65) Prior Publication Data

US 2007/0241419 A1    Oct. 18, 2007

(51) Int. Cl.
*H01L 21/00* (2006.01)

(52) U.S. Cl. ........ 257/401; 257/797; 257/618; 257/626; 257/622; 257/E23.179; 257/E23.132; 438/401; 438/462

(58) Field of Classification Search ............ 438/38, 438/958, FOR. 491, 401, 462, 39, 41, 164, 438/343, 412, FOR. 123; 257/E23.132, 626, 257/E21.055, 170, 449, 452, 466, 496, 571, 257/586, 618, 623, 624, E29.185, E29.329, 257/E21.377, 797
See application file for complete search history.

(56) References Cited

U.S. PATENT DOCUMENTS

| 4,843,037 | A | | 6/1989 | Yablonovitch | |
|---|---|---|---|---|---|
| 4,925,808 | A | * | 5/1990 | Richardson | 438/196 |
| 5,356,823 | A | | 10/1994 | Mitani | |
| 5,640,053 | A | * | 6/1997 | Caldwell | 257/797 |
| 5,933,705 | A | | 8/1999 | Geels | |
| 6,319,837 | B1 | * | 11/2001 | Chittipeddi et al. | 438/692 |
| 6,803,291 | B1 | * | 10/2004 | Fu et al. | 438/401 |
| 6,835,954 | B2 | | 12/2004 | Park et al. | |
| 6,870,225 | B2 | * | 3/2005 | Bryant et al. | 257/347 |
| 7,229,273 | B2 | * | 6/2007 | Bailey et al. | 425/385 |

(Continued)

FOREIGN PATENT DOCUMENTS

JP    2002124523    4/2002

(Continued)

OTHER PUBLICATIONS

International Search Report for corresponding PCT Application No. PCT/US07/63775 mailed Nov. 6, 2008.

(Continued)

*Primary Examiner* — Fei Fei Yeung Lopez
(74) *Attorney, Agent, or Firm* — Sherry W. Schumm (57) ABSTRACT Semiconductor devices (61) and methods (80-89, 100) are provided with dual passivation layers (56, 59). A semiconductor layer (34) is formed on a substrate (32) and covered by a first passivation layer (PL-1) (56). PL-1 (56) and part (341) of the semiconductor layer (34) are etched to form a device mesa (35). A second passivation layer (PL-2) (59) is formed over PL-1 (56) and exposed edges (44) of the mesa (35). Vias (90, 92, 93) are etched through PL-1 (56) and PL-2 (59) to the semiconductor layer (34) where source (40), drain (42) and gate are to be formed. Conductors (41, 43, 39) are applied in the vias (90, 92, 93) for ohmic contacts for the source-drain (40, 42) and a Schottky contact (39) for the gate. Interconnections (45, 47) over the edges (44) of the mesa (35) couple other circuit elements. PL-1 (56) avoids adverse surface states (52) near the gate and PL-2 (59) insulates edges (44) of the mesa (35) from overlying interconnections (45, 47) to avoid leakage currents (46). An opaque alignment mark (68) is desirably formed at the same time as the device (61) to facilitate alignment when using transparent semiconductors (34).

17 Claims, 6 Drawing Sheets

60

U.S. PATENT DOCUMENTS

| | | | |
|---|---|---|---|
| 2003/0160269 A1* | 8/2003 | Inoue et al. | 257/213 |
| 2004/0004262 A1* | 1/2004 | Welch | 257/476 |
| 2004/0147054 A1 | 7/2004 | Haberern | |
| 2004/0168586 A1 | 9/2004 | Bailey et al. | |
| 2005/0258431 A1* | 11/2005 | Smith et al. | 257/79 |
| 2006/0008952 A1* | 1/2006 | Wu et al. | 438/149 |

FOREIGN PATENT DOCUMENTS

| | | |
|---|---|---|
| JP | 2003282597 * | 10/2003 |
| WO | WO 01/13436 | 2/2001 |
| WO | WO 2005/052566 | 6/2005 |
| WO | WO 2005/057624 | 6/2005 |
| WO | WO 2005/060007 | 6/2005 |

OTHER PUBLICATIONS

EPC Application No. 07758334.2; International Search Report; mailed Aug. 14, 2009, Aug. 4, 2009.

* cited by examiner

TRANSISTOR AND METHOD WITH DUAL LAYER PASSIVATION

TECHNICAL FIELD

The present invention generally relates to semiconductor devices, and more particularly relates to semiconductor devices with dual layer passivation.

BACKGROUND

Semiconductor (SC) devices, especially transistors are often sensitive to leakage currents from conductor and interconnections into the semiconductor bulk or substrate, and/or to surface states that may upset the electrical potential in critical device regions. Both effects can degrade the operation of the device and may occur in the same device. What is done to mitigate one problem may adversely affect the other. Such effects are especially encountered with semiconductors that lack a natural passivating oxide, such as is available in the silicon-silicon dioxide system. A further problem encountered with semiconductors other than silicon is that many of them are substantially transparent to the wavelengths of light used for mask alignment between successive fabrication steps. In these circumstances, the alignment marks or features placed on the semiconductor or other substrate are difficult to resolve, thereby making it more difficult and more expensive to fabricate such devices, especially with fine dimensions used for high speed operation. Accordingly, there is a need for improved device structures and methods of fabrication that can mitigate or eliminate such effects.

Accordingly, it is desirable to provide improved semiconductor devices, especially transistors and arrays of transistors, where substrate leakage and surface state effects and alignment problems are minimized, and which are suitable for use with various type IV, III-V, II-VI materials and organic semiconductor compounds. It is further desirable that the methods, materials and structures employed be compatible with present day manufacturing capabilities and materials and not require substantial modifications of available manufacturing procedures or substantial increase in manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

For convenience of explanation and not intended to be limiting, the present invention is described for transistors being formed using GaN semiconductor material for high power, high frequency applications, but this is not essential and the principles taught herein apply to a wide variety of semiconductor materials adapted to operate at many different frequencies or clock speeds. Non-limiting examples of other suitable semiconductor materials are SiC, AlGaN, diamond, and various other type IV, III-V and II-VI compounds and mixtures thereof and organic semiconductors. Accordingly, while GaN is identified a suitable semiconductor material, the present invention is not limited thereto.

Figure 1:
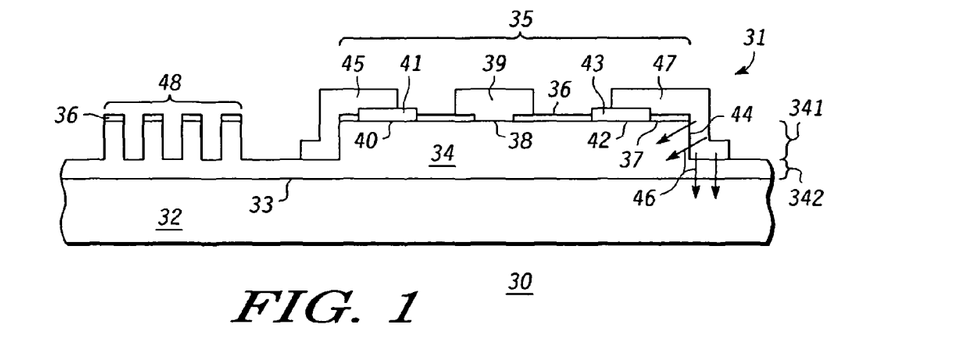
FIGS. 1-3 are simplified schematic cross-sectional views of semiconductor devices illustrating the occurrence of substrate leakage currents (FIG. 1), adverse surface states (FIG. 2), and in FIG. 3, mitigation thereof according to a first embodiment of the present invention.
Figure 2:
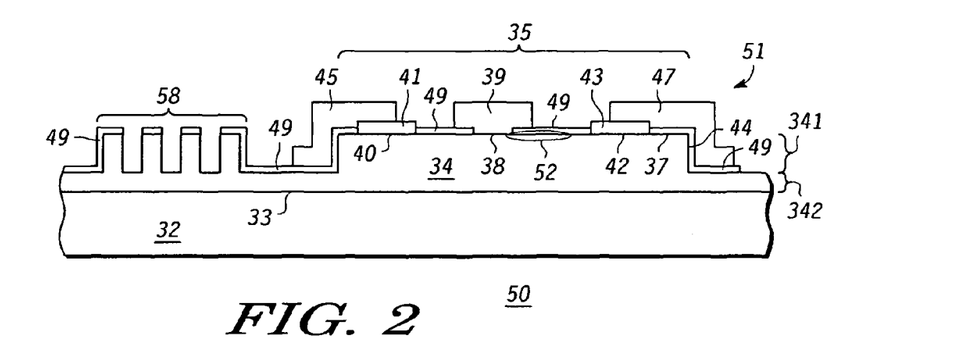
Figure 3:
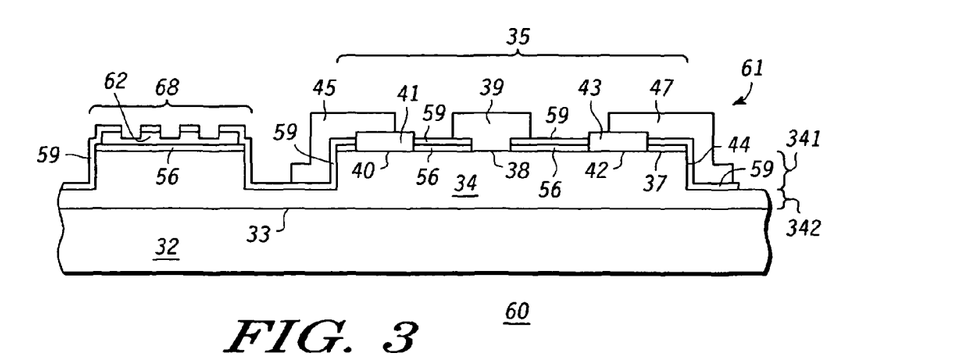

FIGS. 1-3 are simplified schematic cross-sectional views 30, 50, 60 of semiconductor devices 31, 51, 61 illustrating the occurrence of substrate leakage currents 46 in FIG. 1, adverse surface states 52 in FIG. 2, and in FIG. 3, mitigation of both such substrate leakage and adverse surface states according to a first embodiment of the present invention. Like reference numbers are used to identify like regions in FIGS. 1-3.

Because devices 31, 51, 61 have many elements in common, they are described together. Devices 31, 51, 61 are formed in semiconductor (SC) 34 located on surface 33 of substrate 32. Substrate 32 may be of sapphire, Si, SiC, diamond, GaN, AlN and various other generally refractory materials. It is desirable that substrate 32 be substantially insulating. In this example, SC 34 is GaN, a III-V compound, but other type IV, III-V, II-VI and organic semiconductor materials may also be used. Mesa or island 35 containing field effect devices 31, 51, 61 is formed in upper portion 341 of SC 34. Mesa 35 in upper portion 341 provides device to device isolation, while lower portion 342 of SC 34 provides a transition zone so that crystalline imperfections that may arise at interface surface 33 between SC 34 and substrate 32 do not significantly detract from device performance. In most cases, upper portion 341 is thinner than lower portion 342. Source region 40 with source contact 41 and drain region 42 with drain contact 43 are formed on surface 37 of SC 34 using techniques well known in the art, which depend upon the particular material(s) chosen for SC 34. Contacts 41, 43 are conveniently of metals or metal alloys chosen so as to make substantially ohmic contact to SC 34. Gate conductor 39 is formed over channel region 38 on surface 37 of SC 34. Gate conductor 39 is preferably a material that makes a Schottky contact to SC 34, thereby creating the gate of field effect devices 31, 51, 61 over channel region 38. Conductive interconnection 45 electrically couples source contact 41 to various other devices or elements (not shown) and drain interconnection 47 electrically couples drain contact 43 to various other devices or elements (not shown). Gate conductor 39 can also extend to such other elements or devices, so that device 31, 51 or 61 is a single device coupled to bonding pads or one or a large array of devices forming a complex integrated circuit.

In FIG. 1, surface 37 of SC 34 is passivated by dielectric layer 36 of, for example, $Si_3N_4$. In this case, dielectric layer 36 is applied before mesa 35 in upper portion 341 of SC 34 is formed. However, while dielectric layer 36 covers and passivates surface 37, it does not cover edges 44 of mesa 35; thereby permitting leakage currents 46 to flow into SC 34 and substrate 32 from interconnection 47. This can be particularly troublesome with high voltage devices. In FIG. 2, surface 37 and edges 44 of SC 34 are passivated by dielectric layer 49 that is applied after mesa 35 is formed. Dielectric layer 49 covers both upper surface 37 of mesa 35 and edges 44 so that leakage currents 46 are precluded. However, it has been found that, leaving surface 37 exposed during the process of forming mesa 35 can create undesirable surface states, e.g., surface states 52 adjacent channel region 38 or elsewhere, which can cause DC to RF "current collapse," which adversely affects device performance. In FIG. 3, the problems of substrate leakage currents 46 and surface states 52 are mitigated or avoided by providing two passivation layers on mesa 35 of SC 34. In this embodiment, first passivation (e.g., dielectric) layer 56 analogous to layer 36 is applied prior to etching out mesa 35 and second passivation (e.g., dielectric) layer 59 analogous to layer 49 is applied after etching out mesa 35 but before forming the various metal contacts and the interconnections that overlap edges 44 of SC 34. $Si_3N_4$, $SiO_2$, $SiO_xN_y$, AlN, $Al_2O_3$, and combinations or mixtures thereof are suitable dielectrics for both passivation layers, but $Si_3N_4$ is preferred. Thicknesses in the range of about 200 to 2000 Angstrom units are useful with about 500 Angstrom units being preferred for layers 36, 56, 49, 59. Layers 56 and 59 may comprise the same or different materials, depending upon the needs of the designer and the semiconductor materials chosen for the device.

Figure 4:
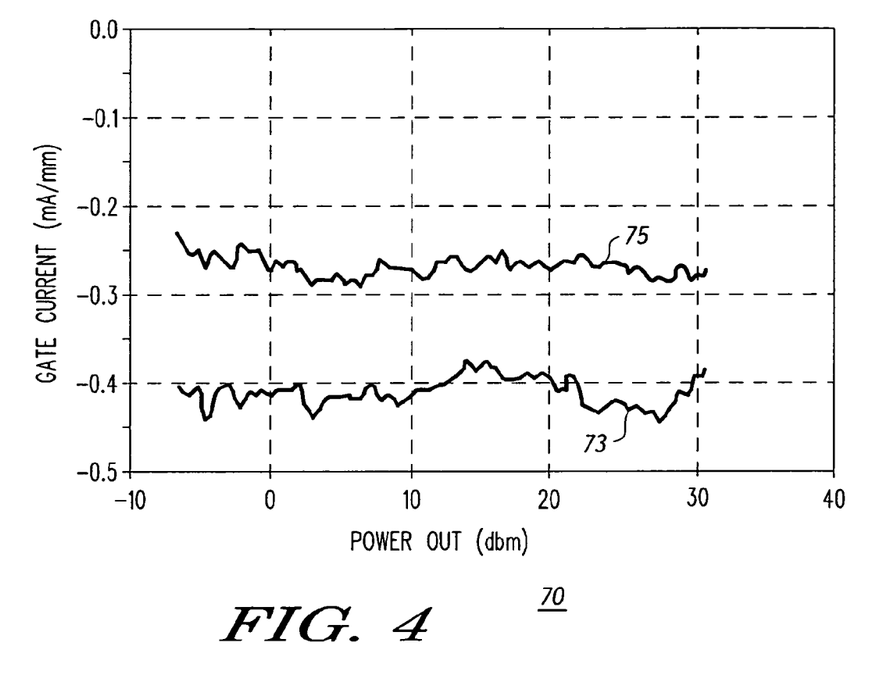
FIG. 4 shows a plot of gate leakage current versus output power with and without the improvements provided by the embodiment of the present invention illustrated in FIG. 3.
Figure 5:
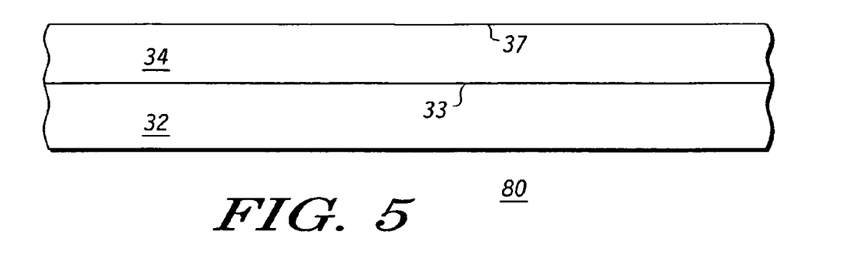
FIGS. 5-14 are simplified schematic cross-sectional views of semiconductor devices according to further embodiments of the present invention, at different stages of manufacture and showing further details.
Figure 6:
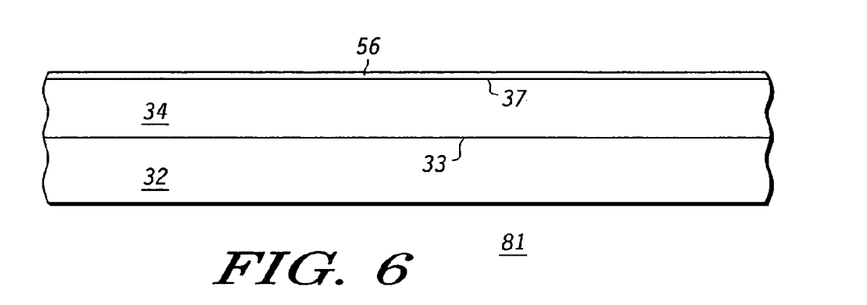
Figure 7:
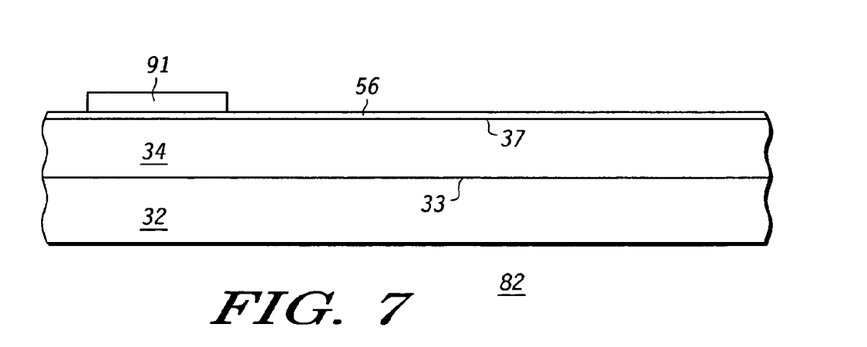
Figure 8:
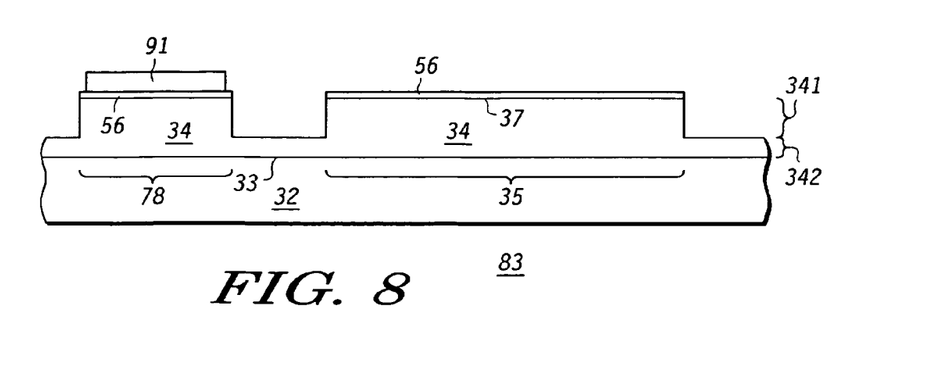
Figure 9:
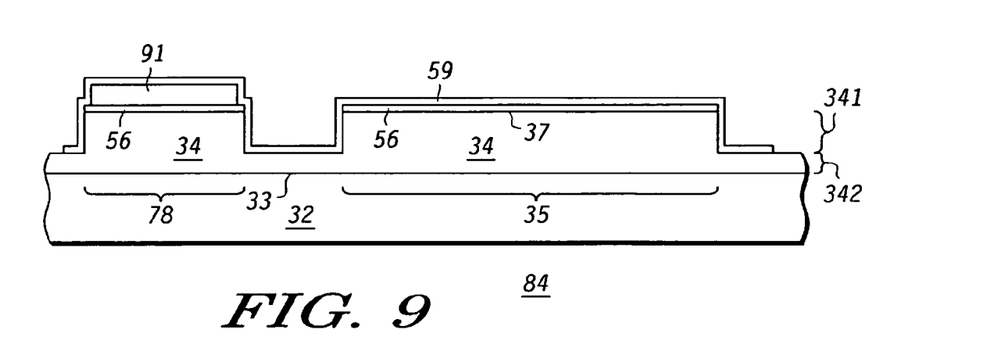
Figure 10:
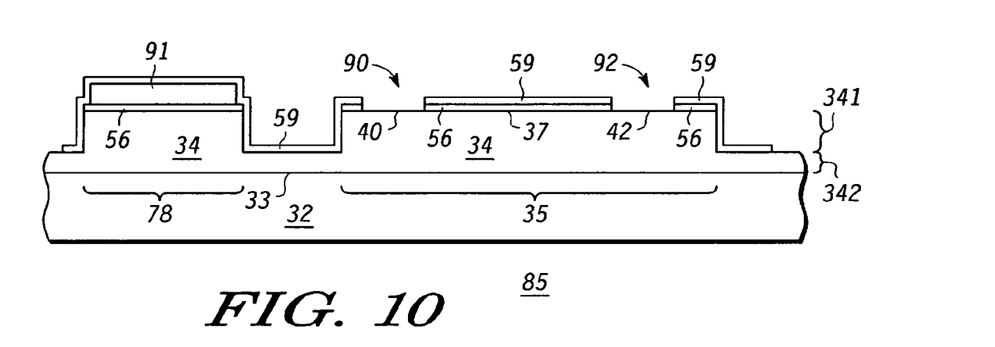
Figure 11:
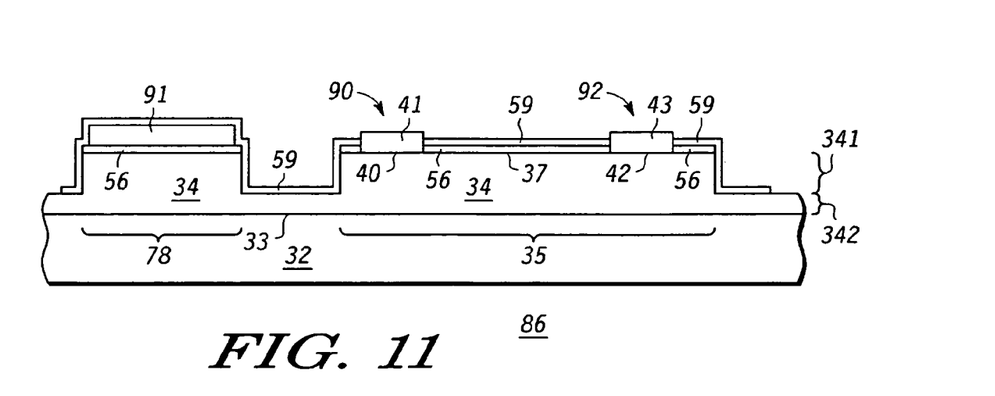

FIG. 4 shows plot 70 of representative data showing the gate leakage for device 61 of FIG. 3 represented by trace 75 compared to the gate leakage current of device 31 of FIG. 1 represented by trace 73, as a function of RF output power. In both cases the substrate used is sapphire. As can be seen from the data, device 61 of FIG. 3 has significantly lower gate leakage than does device 31 of FIG. 1.

Figure 12:
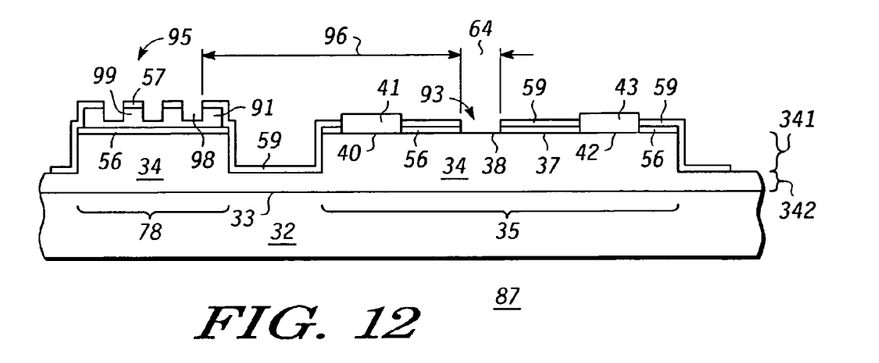
Figure 13:
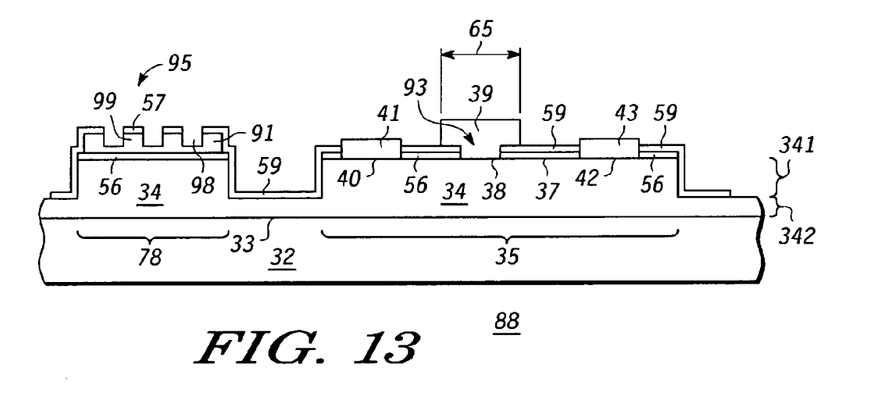
Figure 14:
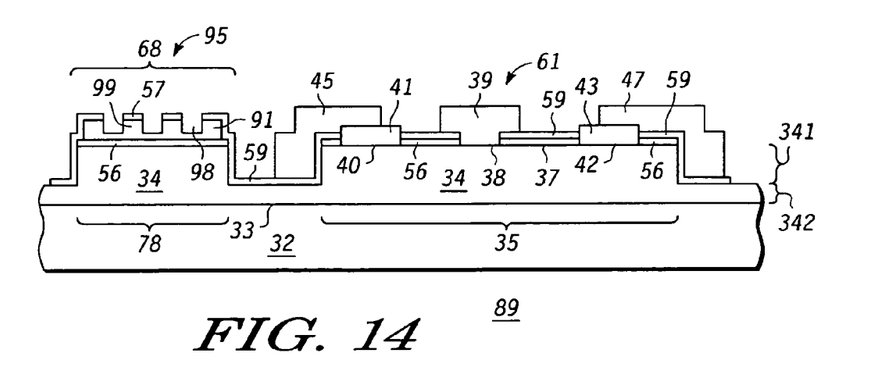

FIGS. 5-14 are simplified schematic cross-sectional views of semiconductor device 61 of FIG. 3, according to still further embodiments of the present invention, at different stages 80-89 of manufacture and showing further details. In stage 80 of FIG. 5, substrate 32 of, for example, sapphire, Si, SiC, diamond, GaN, AlN or various other generally insulating materials is provided. Sapphire is convenient. Semiconductor (SC) 34 is formed on surface 33 of substrate 32 by, for example, Metal-Organo Chemical Vapor Deposition (MOCVD) or Molecular Beam Epitaxy (MBE), with MOCVD being preferred for GaN. A nucleation layer of GaN or AlGaN may be provided on surface 33 prior to growth of SC 34 of GaN, to induce SC 34 to form a crystalline structure, preferably single crystal, although that is not essential for the present invention. SC 34 has a thickness usefully in the range of about 1 to 3 micrometers, preferably about 2 to 2.5 micrometers, but thicker and thinner layers may also be used. In stage 81 of FIG. 6, first passivation (e.g., insulating dielectric) layer 56 is applied, for example, by chemical vapor deposition (CVD), plasma enhanced chemical vapor deposition (PECVD), evaporation, sputtering or other well known techniques. CVD is preferred, with thicknesses in the range of about 200 to 5000 Angstrom units being useful and about 500 Angstrom units being preferred. $Si_3N_4$, $SiO_2$, $SiO_xN_y$, AlN, $Al_2O_3$, and combinations or mixtures thereof are suitable dielectrics for layer 56, but $Si_3N_4$ is preferred. Persons of skill in the art will understand that the choice of material for first passivation or insulating layer 56 will depend upon the choice of material for SC 34. What is important is that it substantially render surface 37 of SC 34 stable and electrically neutral (i.e., without significant surface states) and that it remain so during subsequent processing steps. In stage 82 of FIG. 7, an optically opaque refractory material is deposited or otherwise formed on first passivation or insulating layer 56 and patterned to form region 91, which will subsequently form a part of alignment mark 68 (see FIG. 3). As used herein, the terms "optically opaque" and "opaque" are intended to refer to those wavelengths used for alignment of masking layers used in the fabrication of device 61 and the like, either as individual devices or arrays of such devices. For convenience of illustration, only a single alignment mesa 78 and opaque region 91 thereon are shown in connection with the fabrication of device 61, but persons of skill in the art will understand that multiple alignment mesas 78 and opaque regions 91 may be formed in connection with device 61 and or arrays of devices 61, for use during different stages of manufacture of device(s) 61 and alignment pattern(s) analogous to feature 95 of FIG. 12 formed therein at such different stages of manufacture. It is important that region 91 be significantly opaque at these wavelengths so that it can be easily seen as successive masks are aligned to previous patterns. Polycrystalline silicon is a preferred material for forming region 91, but other substantially opaque materials able to withstand subsequent processing steps may also be used. Non-limiting examples of alternate materials for region 91 are platinum and nickel. For convenience of description and not intended to be limiting, region 91 is referred to hereafter as poly-region 91 even though it may be amorphous or single crystalline and of other materials besides silicon. Various techniques for forming region 91 (e.g., evaporation, CVD, PECVD, etc.) and for patterning region 91 (e.g., photoresist masking and etching) of polycrystalline silicon and/or other substantially opaque, generally refractory materials are well known in the art. Evaporation is preferred for forming poly-region 91. For silicon, thicknesses in the range of about 500 to 2000 Angstrom units are useful with about 1000 Angstrom units being preferred. In stage 83 of FIG. 8, the structure illustrated in stage 82 is masked (e.g., with photoresist) and etched to form device mesa 35 in which device 61 will be formed and alignment mesa 78 on which alignment mark 68 will be formed incorporating poly-region 91. Poly-region 91 can be used as an alignment mark for locating device mesa 35 relative to alignment mesa 78. Poly-region 91 and alignment mesa 78 can be substantially coincident but that is not essential. Layer 56 and SC 34 are conveniently etched using plasma etching to form mesas 35, 78, but other etching procedures may also be used. In stage 84 of FIG. 9, second passivation or insulating layer 59 is conveniently applied substantially conformally over the structure of stage 83. While layer 59 preferably overlies both device mesa 35 and alignment mesa 78, this is not essential and it need only overlie device mesa 35. $Si_3N_4$, $SiO_2$, $SiO_xN_y$, AlN, $Al_2O_3$, and combinations or mixtures thereof are suitable dielectrics for layer 59, but $Si_3N_4$ is preferred. CVD is a preferred formation technique. Thicknesses in the range of about 200 to 2000 Angstrom units are useful with about 500 Angstrom units being preferred. In stage 85 of FIG. 10, source via 90 and drain via 92 are opened through layers 59, 56 to surface 37 of SC 34 to expose the locations desired for source region 40 and drain region 42. Poly-region 91 conveniently serves as an alignment mark to locate vias 90, 92 on device mesa 35. Photoresist is conveniently used as a mask to etch vias 90, 92 through layers 59, 56. In stage 86 of FIG. 11, source contact 41 is formed in source via 90 and drain contact 43 is formed in drain via 92, preferably using a lift-off process taking advantage of the same photoresist mask layer used to form vias 90, 92. Lift-off metallization processes are well known in the art but not essential, and a conventional metal deposition and masking and etching sequence may also be used. Contacts 41, 43 are desirably formed of metals that provide ohmic contact to SC 34. When GaN is used for SC 34, contacts 41, 43 are preferably of layered TiAlMoAu or TiAlNiAu formed by evaporation, with the Ti layer in contact with SC 34. Other metal combinations and formation procedures can also be used. Annealing of contacts 41, 43 to provide ohmic contact to the channel is preferably accomplished using either a furnace or rapid thermal annealer (RTA) and can be performed at this step or at any other step in the process preceding the deposition of the gate conductor 39. In stage 87 of FIG. 12, gate via 93 of length 64 (in the source-drain direction) is opened through layers 59, 56 to surface 37 of SC 34 where channel region 38 is desired to be located. At the same time as gate via 93 is opened, alignment feature 95 is etched through the portion of layer 59 on alignment mesa 78 to, into or through poly-region 91 so that distance 96 from gate via 93 to alignment feature 95 is well determined. Alignment feature 95 accurately sets the location of gate via 93 between source-drain regions 40, 42. While alignment feature 95 is shown in FIG. 12 as having trenches 98 extending part way through poly-region 91 separated by full-thickness portions 99, this is not essential. Alignment trenches 98 may extend only through layer 59 above poly-region 91 or part way through poly-region 91 (e.g., as is depicted in FIGS. 12-14) or all the way through poly-region 91 to underlying SC 34. When underlying SC 34 is of GaN (and various other semiconductor materials), it is substantially transparent at the alignment wavelengths. Therefore it is desirable to leave portions 99 of poly-region 91 between trenches 98 to provide substantial contrast during alignment operations, since portion 57 of layer 59 above amorphous or poly-silicon region 91 may not, by itself, provide sufficient contrast to facilitate accurate alignment of subsequent masks. Thus, even if layers 59, 56 and SC 34 are substantially transparent at the alignment wavelengths, amorphous or polysilicon portions 99 separated by trenches 98 provide the desired pattern contrast for accurate alignment. The filtering of the reflected broadband alignment light by the optical interface created between portion 57 of second passivation layer 59 above full thickness portions 99 makes alignment feature 95 highly visible. Hence, having layer 59 extend over poly-region 91 is desirable. In stage 88 of FIG. 13, gate conductor 39 is provided in gate via 93 to form the desired Schottky gate on SC 34. A conventional photoresist step is conveniently used to define the lateral extent of gate conductor 39. Alignment feature 95 formed in manufacturing stage 87 permits very accurate alignment of gate conductor 39 to gate via 93 so that the overlap of gate conductor 39 on either side of gate via 93 can be carefully controlled. It is desirable that length 65 (in the source-drain direction) of gate conductor 39 be somewhat larger than the length 64 of gate via 93 so that gate conductor 39 overlaps passivation layers 56, 59 on either side of gate via 93. Ni and Pt are suitable metals for forming the desired Schottky gate contact on GaN. It is preferred that gate conductor 39 be a layered structure, as for example, NiAu or PtAu with about 200 to 400 Angstroms of Ni or Pt on SC 34 to provide the desired Schottky contact, surmounted by several thousand Angstrom units of Au to provide lower resistance, but other metals, semi-metals, semiconductors and combinations thereof can also be used for gate conductor 39. Vacuum evaporation is a suitable technique for forming gate conductor 39, but other well known deposition processes may also be used. In stage 89 of FIG. 14, interconnections 45, 47 are formed, preferably also evaporated layered metal structures, to provide good adhesion and low resistance. NiAu and PtAu combinations are suitable, but many other conductive materials well known in the art can also be used. Fabrication stages 88 and 89 may be combined so that interconnections 45, 47 and gate conductor 39 are formed of the same materials and during the same metallization, masking and etching step. The structure obtained in stage 89 of FIG. 14 corresponds to device 61 and alignment mark 68 of FIG. 3.

Figure 15:
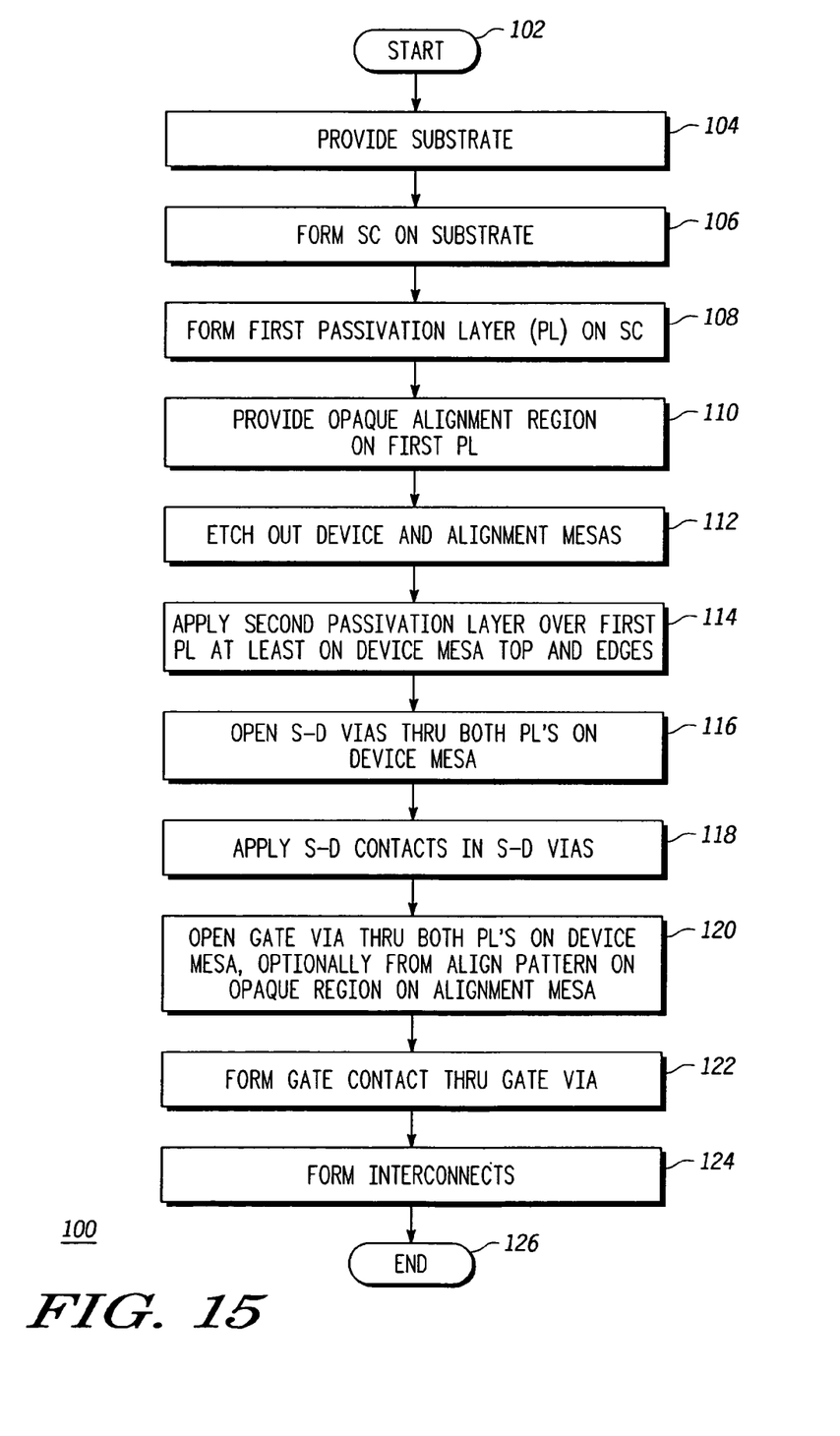
FIG. 15 is a simplified flow chart illustrating a method of fabricating a semiconductor device and associated alignment mark, according to still further embodiments of the present invention.

FIG. 15 is a simplified flow chart illustrating method 100 of fabricating a transistor such as device 61 of FIGS. 3 and 14 and associated alignment mark 68, according to a further embodiment of the present invention. Device 61 may be a single device or one of a large array of devices using single or multiple alignment mark(s) 68. Method 100 begins with START 102 and initial step 104 wherein substrate 32 is fabricated or otherwise provided of, for example and not intended to be limiting, sapphire, silicon carbide and/or silicon. In step 106, semiconductor layer (SC) 34 of, for example and not intended to be limiting, gallium nitride is formed on substrate 32 as has been described in connection with FIG. 5. In step 108, first passivation or insulating layer 56 is formed on surface 37 of SC 34 as described in connection with FIG. 6. In step 110 corresponding to FIG. 7, opaque alignment region 91 of, for example and not intended to be limiting, amorphous or polycrystalline silicon is formed by conventional deposition, masking and etching. In step 112 corresponding to FIG. 8, device mesa 35 and alignment mesa 78 are etched out in upper portion 341 of SC 34, by for example and not intended to be limiting, plasma etching employing chlorine and/or fluorine containing gases. Device mesa 35 in upper portion 341 conveniently has a thickness of about 2000 to 3000 Angstrom units with about 2500 Angstrom units being preferred for gallium nitride. In step 114 corresponding to FIG. 9, second passivation or insulating layer 59 is applied at least over first passivation or insulating layer 56 on the top and side edges of device mesa 35 and preferably but not essentially also over region 91 on alignment mesa 78 where it can conveniently serve as an etch mask and optical interference layer. In subsequent step 116 corresponding to FIG. 10, source-drain (S-D) vias 90, 92 are etched through first and second passivation layers (PL's) 56, 59, referred to as PL-1 (i.e., layer 56) and PL-2 (i.e., layer 59) respectively, to expose those portions of surface 37 of SC 34 where source-drain regions 40, 42 are desired to be formed, as described in connection with stage 85 of FIG. 10. Amorphous or poly-region 91 provides an alignment reference for this operation, which conveniently employs a conventional photoresist mask and passivation layer etching in vias 90, 92. In step 118, source-drain contacts 41, 43 are applied through vias 90 as has already been described in connection with FIG. 11. Source-drain contacts 41, 43 are preferably annealed using rapid thermal annealing (RTA) at this stage or any stage prior to formation of gate contact 39, In step 120 corresponding to FIG. 12, gate via 93 is formed through layers 59, 56 between source-drain regions 40, 42 where channel region 38 is desired to be located. At the same time alignment feature 95 separated from gate via 93 by distance 96 is optionally etched into layer 59 and poly-region 91 above alignment mesa 78, as illustrated in FIG. 12. Alignment feature 95 has trenches 98 separated by portions or pillars or portions 99 of opaque material of poly-region 91 desirably covered by portion 57 of second passivation layer 59 so as to provide a high contrast image when viewed at the wavelengths used for mask alignment. In step 122 corresponding to FIG. 13, gate contact 39 of length (in the source-drain direction) 65 is formed in gate via 93 so as to be in contact with surface 37 of SC 34 in via 93, thereby providing a Schottky contact to channel region 38, as is desired. Suitable materials for gate contact 39 are described in connection with FIG. 13. In step 124 of method 100, interconnections 45, 47 are provided as has been described in connection with FIG. 14. Interconnections 45, 47 (and gate conductor 39) can serve to electrically couple single device 61 to bonding pads (not shown) or to electrically couple an array of devices 61 to form a complex integrated circuit. Following step 124, method 100 proceeds to END 126 or such other process steps as may be desired to place device 61 or an array of devices 61 in a package or enclosure or otherwise provide environmental protection and testing. Such additional processing and testing steps are conventional and beyond the scope of the present invention.

While alignment feature 95 has been described as being fabricated in connection with forming gate via 93, and this is desirable, it will be appreciated that provision of such an alignment feature is not limited merely to this manufacturing stage but that similar alignment features may be formed on other alignment mesas 78 located elsewhere on substrate 32 in connection with other manufacturing stages of device 61. For example and not intended to be limiting, a multiplicity of alignment mesas 78 with corresponding alignment opaque regions 91, e.g., one for each critical alignment stage, may be provided in connection with device 61 and an alignment pattern equivalent to alignment feature 95 formed in one of these further alignment mesas and opaque regions 91 each time vias are intended to be provided through passivation layers 56, 59 or various conductor layers are to be patterned, and so forth. What is important to facilitate such alignment steps is that alignment opaque region 91 or equivalent be provided in connection with these other alignment features, so that the above-described alignment contrast may be obtained. Opaque region 91 and alignment feature 95 are shown as being formed on mesa 78, and while this is convenient, it is not essential, that is, opaque region 91 need not be placed on an elevated, mesa-like structure but may be located on other portions of SC 34 and/or substrate 32. What is important is that opaque region 91 has a known geometric relationship to mesa or other region 35 in which device 61 (or other type of device) is being fabricated. Thus, term "mesa" as used in conjunction with alignment mark 68 is intended to include any region for supporting opaque region 91, whether elevated or not. Further, it is not necessary that the same opaque material be used for all alignment features. For example, metals used for contacts and interconnects are generally opaque and may also be used for alignment purposes.

According to a first embodiment, there is provided a method for forming a semiconductor device, comprising, providing a substrate having a principal surface, forming a semiconductor layer on the principal surface of the substrate, wherein the semiconductor layer has an outer surface, providing a first passivation layer on the outer surface, locally etching portions of the first passivation layer and the semiconductor layer to form a device mesa above the principal surface, wherein the device mesa has an upper surface still covered by the first passivation layer and its lateral edges exposed, forming a second passivation layer at least over the first passivation layer on the upper surface of the device mesa and the exposed lateral edges of the device mesa, providing source-drain and gate vias through the first and second passivation layers to the upper surface of the semiconductor layer on the device mesa, and forming conductors in the vias so as to provide ohmic contact to the semiconductor in the source-drain vias and a Schottky contact to the semiconductor in the gate via. According to a further embodiment, the step of locally etching portions of the first passivation layer and the semiconductor layer further comprises at the same time also forming one or more alignment mesas located a pre-determined distance from the device mesa. According to a still further embodiment, the method comprises before the step of forming the second passivation layer, providing an alignment region of an optically opaque material on at least some of the one or more alignment mesas. According to a yet further embodiment, the step of providing source-drain and gate vias further comprises forming an alignment pattern in at least one of the one or more alignment mesa at the same time as opening the source-drain vias or the gate via. According to a still yet further embodiment, the step of forming a semiconductor layer comprises, forming a layer comprising a III-V compound. According to a still yet further embodiment, the step of forming a semiconductor layer comprises, forming a layer comprising GaN. According to another embodiment, the step of providing a first passivation layer comprises, providing a layer comprising silicon and nitrogen. According to a yet another embodiment, the step of forming a second passivation layer comprises, providing a layer comprising silicon and nitrogen. According to a still another embodiment, the step of forming conductors in the vias comprises forming source-drain contacts comprising aluminum. According to a still yet another embodiment, the step of forming conductors in the vias comprises forming a gate conductor comprising Ni or Pt.

According to a second embodiment, there is provided a semiconductor device, comprising, a supporting substrate, a semiconductor, optically transparent at wavelengths used for alignment, located on the supporting substrate and having an outer surface spaced apart from the substrate and lateral edges extending from the outer surface toward the supporting substrate, a first insulating passivating layer of a first material on the outer surface for passivating the outer surface, a second insulating passivating layer of a second material on the first layer and extending over a portion of the lateral edges so as to provide an insulated pathway extending from the outer surface across the portion of the lateral edges, via openings through the first and second layers extending to the outer surface, conductors extending into the via openings to make electrical contact to the outer surface of the semiconductor to form source-drain and gate contacts thereon, and interconnections extending from some or all of the contacts over the lateral edges on the insulated pathway formed by the second layer. According to a further embodiment, the semiconductor is GaN. According to a still further embodiment, the first insulating passivating layer comprises one or another of $Si_3N_4$, $SiO_2$, $SiO_xN_y$, AlN, or $Al_2O_3$, or combinations or mixtures thereof. According to a yet further embodiment, the second insulating passivating layer comprises one or another of $Si_3N_4$, $SiO_2$, $SiO_xN_y$, AlN, or $Al_2O_3$, or combinations or mixtures thereof.

According to a third embodiment there is provided a method of forming an alignment mark associated with a semiconductor device, comprising, providing a substrate having a principal surface, forming a semiconductor layer on the principal surface of the substrate, wherein the semiconductor layer is substantially optically transparent at a wavelength used for alignment and has an outer surface, providing a first dielectric layer on the outer surface, locally etching portions of the first dielectric layer and the semiconductor layer to form a device region and an alignment region above the principal surface, forming an optically opaque region on the alignment region, wherein the optically opaque region is optically opaque at the wavelength used for alignment, forming a second dielectric layer over the device region and the optically opaque region on the alignment region, and forming an alignment pattern in the second dielectric layer on the alignment region at the same time as opening one or more vias in the dielectric layers on the device region. According to a further embodiment, the step of forming a semiconductor layer comprises forming a layer of GaN. According to a still further embodiment, the step of forming an optically opaque region comprises forming a region compriing silicon. According to a yet further embodiment, the step of providing a first dielectric layer comprises, forming a layer comprising $Si_3N_4$, $SiO_2$, $SiO_xN_y$, AlN, or $Al_2O_3$, or combinations or mixtures thereof. According to a still yet further embodiment, the step of forming a second dielectric layer comprises, forming a layer comprising $Si_3N_4$, $SiO_2$, $SiO_xN_y$, AlN, or $Al_2O_3$, or combinations or mixtures thereof. According to a yet still further embodiment, the step of forming an alignment pattern in the second dielectric layer on the alignment region, comprises etching away portions of the second dielectric layer and part of the optically opaque region.

While at least one exemplary embodiment has been presented in the foregoing detailed description, it should be appreciated that a vast number of variations exist, especially with respect to choices of substrate 32, semiconductor 34, passivation or insulating or dielectric layers 56, 59, contacts, conductors and interconnections 41, 43, 39, 45, 47 and the particular design of alignment mark or feature 68, 95. Further, while device(s) 61 are shown as being formed in mesa(s) 35 for isolation purposes, persons of skill in the art will understand based on the description herein that other isolation arrangements may also be used according to further embodiments of the present invention, as for example, and not intended to be limiting, etch and refill trenches and/or surrounding ion implanted regions forming the electrical equivalent of device mesa(s) 35. Accordingly, as used herein, the term "mesa" as applied to device(s) 61 is intended to include such other forms of isolation. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a semiconductor device on a substrate having a principal surface, the method comprising:
    forming a semiconductor layer on the principal surface of the substrate, wherein the semiconductor layer has an outer surface opposite the substrate;
    forming a first passivation layer on the outer surface of the semiconductor layer opposite the substrate by providing a layer comprising silicon and nitrogen;
    locally etching away portions of the first passivation layer and the semiconductor layer to thereby form a device mesa above the principal surface of the substrate, wherein the device mesa has an upper surface still covered by the first passivation layer and wherein the device mesa further has exposed lateral edges where the first passivation layer and the semiconductor layer has been removed;
    after the etching step, forming a second passivation layer at least over the first passivation layer on the upper surface of the device mesa and the exposed lateral edges of the device mesa, wherein the second passivation layer is a single and substantially contiguous layer that continuously extends across the entire upper surface of the device mesa and that also completely covers the exposed lateral edges of the device mesa;
    after forming the second passivation layer, providing source-drain vias and a gate via through the first and second passivation layers to the upper surface of the semiconductor layer on the device mesa; and
    forming conductors in the vias so as to provide ohmic contact to the semiconductor layer in the source-drain vias and a Schottky contact to the semiconductor layer in the gate via.

2. A method for forming a semiconductor device on a substrate having a principal surface, the method comprising:
    forming a semiconductor layer on the principal surface of the substrate, wherein the semiconductor layer has an outer surface opposite the substrate;
    forming a first passivation layer on the outer surface of the semiconductor layer opposite the substrate;
    locally etching away portions of the first passivation layer and the semiconductor layer to thereby form a device mesa above the principal surface of the substrate, wherein the step of locally etching portions of the first passivation layer and the semiconductor layer further comprises at the same time also forming one or more alignment mesas located a pre-determined distance from the device mesa, wherein the device mesa has an upper surface still covered by the first passivation layer and wherein the device mesa further has exposed lateral edges where the first passivation layer and the semiconductor layer has been removed;
    after the etching step, forming a second passivation layer at least over the first passivation layer on the upper surface of the device mesa and the exposed lateral edges of the device mesa, wherein the second passivation layer is a single and substantially contiguous layer that continuously extends across the entire upper surface of the device mesa and that also completely covers the exposed lateral edges of the device mesa;

after forming the second passivation layer, providing source-drain vias and a gate via through the first and second passivation layers to the upper surface of the semiconductor layer on the device mesa; and forming conductors in the vias so as to provide ohmic contact to the semiconductor layer in the source-drain vias and a Schottky contact to the semiconductor layer in the gate via.

3. The method of claim 2, further comprising before the step of forming the second passivation layer, providing an alignment region of an optically opaque material on at least some of the one or more alignment mesas.

4. The method of claim 3, wherein the step of providing source-drain and gate vias further comprises forming an alignment pattern in at least one of the one or more alignment mesas at the same time as opening the source-drain vias or the gate via.

5. The method of claim 1, where the step of forming the semiconductor layer comprises, forming a layer comprising a III-V compound.

6. The method of claim 1, wherein the step of forming the semiconductor layer comprises, forming a layer comprising GaN.

7. The method of claim 1, wherein the step of forming the second passivation layer comprises, providing a layer comprising silicon and nitrogen.

8. The method of claim 1, wherein the step of forming conductors in the vias comprises forming source-drain contacts comprising aluminum.

9. The method of claim 1, wherein the step of forming conductors in the vias comprises forming a gate conductor comprising Ni or Pt.

10. A method of forming an alignment mark associated with a semiconductor device, comprising:
   providing a substrate having a principal surface;
   forming a semiconductor layer on the principal surface of the substrate, wherein the semiconductor layer is substantially optically transparent at a wavelength used for alignment and has an outer surface;
   providing a first dielectric layer on the outer surface;
   locally etching portions of the first dielectric layer and the semiconductor layer to form a device region and an alignment region above the principal surface, wherein the device region comprises an upper surface covered by the first dielectric layer with exposed lateral edges where the first dielectric layer and the semiconductor layer have been removed;
   forming an optically opaque region on the alignment region, wherein the optically opaque region is optically opaque at the wavelength used for alignment;
   forming a second dielectric layer over the device region and the optically opaque region on the alignment region, wherein the second dielectric layer is a single and substantially contiguous layer that continuously covers the entire upper surface of the device region and that also completely covers the exposed lateral edges of the device region; and
   forming an alignment pattern in the second dielectric layer on the alignment region at the same time as opening one or more vias in the dielectric layers on the device region.

11. The method of claim 10, wherein the step of forming the semiconductor layer comprises forming a layer of GaN.

12. The method of claim 10, wherein the step of forming the optically opaque region comprises forming a region comprising silicon.

13. The method of claim 10, wherein the step of providing the first dielectric layer comprises, forming a layer comprising $Si_3N_4$, $SiO_2$, $SiO_xN_y$, AlN, or $Al_2O_3$, or combinations or mixtures thereof.

14. The method of claim 10, wherein the step of forming the second dielectric layer comprises forming a layer comprising $Si_3N_4$, $SiO_2$, $SiO_xN_y$, AlN, or $Al_2O_3$, or combinations or mixtures thereof.

15. The method of claim 10, wherein the step of forming an alignment pattern in the second dielectric layer on the alignment region, comprises etching away portions of the second dielectric layer and part of the optically opaque region.

16. A method for forming a semiconductor device on a substrate having a principal surface, the method comprising:
   forming a semiconductor layer on the principal surface of the substrate, wherein the semiconductor layer has an outer surface opposite the substrate;
   forming a first passivation layer on the outer surface of the semiconductor layer opposite the substrate;
   locally etching away portions of the first passivation layer and the semiconductor layer to thereby form a device mesa above the principal surface of the substrate, wherein the device mesa has an upper surface still covered by the first passivation layer and wherein the device mesa further has exposed lateral edges where the first passivation layer and the semiconductor layer has been removed;
   after the etching step, forming a second passivation layer at least over the first passivation layer on the upper surface of the device mesa and the exposed lateral edges of the device mesa, wherein the second passivation layer is a single and substantially contiguous layer that continuously extends across the entire upper surface of the device mesa and that also completely covers the exposed lateral edges of the device mesa, and wherein the first and second passivation layers are formed of the same material;
   after forming the second passivation layer, providing source-drain vias and a gate via through the first and second passivation layers to the upper surface of the semiconductor layer on the device mesa; and
   forming conductors in the vias so as to provide ohmic contact to the semiconductor layer in the source-drain vias and a Schottky contact to the semiconductor layer in the gate via.

17. A method for forming a semiconductor device on a substrate having a principal surface, the method comprising:
   forming a semiconductor layer on the principal surface of the substrate, wherein the semiconductor layer has an outer surface opposite the substrate;
   forming a first passivation layer on the outer surface of the semiconductor layer opposite the substrate by providing a layer comprising silicon and nitrogen;
   locally etching away portions of the first passivation layer and the semiconductor layer to thereby form a device mesa above the principal surface of the substrate, wherein the device mesa has an upper surface still covered by the first passivation layer and wherein the device mesa further has exposed lateral edges where the first passivation layer and the semiconductor layer has been removed;
   after the etching step, forming a second passivation layer at least over the first passivation layer on the upper surface of the device mesa and the exposed lateral edges of the device mesa, wherein the second passivation layer is a single and substantially contiguous layer that continuously extends across the entire upper surface of the device mesa and that also completely covers the exposed lateral edges of the device mesa;

after forming the second passivation layer, providing source-drain vias and a gate via through the first and second passivation layers to the upper surface of the semiconductor layer on the device mesa; and forming conductors in the vias so as to provide contact to the semiconductor layer in the source-drain vias and in the gate via.

* * * * *